US006960941B2

(12) United States Patent
Cantin et al.

(10) Patent No.: US 6,960,941 B2
(45) Date of Patent: Nov. 1, 2005

(54) LATCH CIRCUIT CAPABLE OF ENSURING RACE-FREE STAGING FOR SIGNALS IN DYNAMIC LOGIC CIRCUITS

(75) Inventors: Jason Frederick Cantin, Madison, WI (US); Michael Ju Hyeok Lee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 10/803,588

(22) Filed: Mar. 18, 2004

(65) Prior Publication Data

US 2005/0206423 A1 Sep. 22, 2005

(51) Int. Cl.[7] .......................... H03F 3/45; H03K 3/356

(52) U.S. Cl. ........................ 327/57; 327/208; 327/217; 327/218; 326/94; 326/95

(58) Field of Search ............................... 327/199, 200, 327/202, 203, 208, 215, 217, 225, 57, 218; 326/94, 95, 97

(56) References Cited

U.S. PATENT DOCUMENTS 3,671,768 A * 6/1972 Cooperman ................. 327/217
3,971,960 A 7/1976 Means et al. ............... 327/198
4,093,878 A 6/1978 Paschal et al. .............. 327/198
4,334,157 A 6/1982 Ferris ......................... 327/218
5,095,225 A * 3/1992 Usui .......................... 327/211
5,221,867 A 6/1993 Mitra et al. .................... 326/39
5,760,610 A 6/1998 Naffziger ..................... 326/93
5,793,236 A * 8/1998 Kosco ........................ 327/218
6,271,701 B1 * 8/2001 DiTommaso ................ 327/210
6,781,411 B2 * 8/2004 Steiss et al. .................. 326/46

* cited by examiner

*Primary Examiner*—Tuan T. Lam
(74) *Attorney, Agent, or Firm*—Casimer K. Salys; Dillon & Yudell LLP

(57) ABSTRACT

A latch circuit capable of ensuring race-free staging for signals in dynamic logic circuits is disclosed. The latch circuit includes four separate logic gates. The first inputs of the first and second logic gates are connected to a first and second precharged internal nodes of the dynamic logic circuit, respectively. The second inputs of the first and second gates are connected to a first and second differential outputs of the dynamic logic circuit, respectively. The first inputs of the third and fourth gates are connected to an output of the first and second logic gates, respectively. The second input of the fourth gate is connected to an output of the third logic gate to provide a first output for the latch circuit. Similarly, the second input of the third logic gate is connected to the output of the fourth logic gate to provide a second output for the latch circuit.

9 Claims, 4 Drawing Sheets

OUT_H OUT_L 10 15 16 17 18 41 42 43 44 45 40 IN_H IN_L CLOCK

LATCH CIRCUIT CAPABLE OF ENSURING RACE-FREE STAGING FOR SIGNALS IN DYNAMIC LOGIC CIRCUITS

BACKGROUND OF THE INVENTION

1. Technical Field

The present invention relates to digital circuits in general, and in particular to latch circuits. Still more particularly, the present invention relates to a latch circuit capable of ensuring race-free staging of signals for dynamic logic circuits.

2. Description of Related Art

When two latch circuits are cascaded in series with few or no logic circuits in between, it is possible for data to race through the first latch circuit and corrupt the data in the second latch circuit. Such race condition can be caused by many reasons. For example, the delay for storing data in the first latch circuit may be too small, the clock signal may reach the second latch circuit relatively late in time, or the hold time for the second latch circuit may be too large. The problem of race condition is particularly prominent for logic circuits in which clocks are intentionally delayed to save power.

There are several known solutions to the race condition problem. The most common solution is to insert a number of buffers (i.e., inverters) or delay elements between the output of the first latch circuit and the input of the second latch circuit. However, it is difficult to ascertain the exact number of buffers or delay elements that need to be inserted. On the one hand, too many buffers or delay elements will waste power and space and may even limit clock frequency; but on the other hand, too few buffers or delay elements will not solve the race condition problem. Another common solution (for edge-triggered logic circuits) is to insert a third latch circuit between the first and the second latch circuits. The third latch circuit is triggered on the opposite edge of the clock to prevent the new data from reaching the second latch circuit until a full phase has lapsed after the clock edge. Unfortunately, such solution places an additional load on the clock distribution network, which may lead to too much power and space being consumed. In essence, none of the known solutions is completely satisfactory. Besides, for all the known solutions, a signal is only delayed enough to prevent race conditions between two consecutive latch circuits. In other words, more buffers, delay elements or latch circuits are required if a signal is to be delayed for more than one cycle.

Consequently, it is desirable to provide an improved latch circuit that is capable of overcoming race conditions within dynamic logic circuits.

SUMMARY OF THE INVENTION

In accordance with a preferred embodiment of the present invention, a latch circuit capable of ensuring race-free staging of signals for a dynamic logic circuit includes four separate logic gates. The first inputs of the first and second logic gates are connected to a first and second precharged internal nodes of the dynamic logic circuit, respectively. The second inputs of the first and second gates are connected to a first and second differential outputs of the dynamic logic circuit, respectively. The first inputs of the third and fourth gates are connected to an output of the first and second logic gates, respectively. The second input of the fourth gate is connected to an output of the third logic gate to provide a first output for the latch circuit. Similarly, the second input of the third logic gate is connected to the output of the fourth logic gate to provide a second output for the latch circuit.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
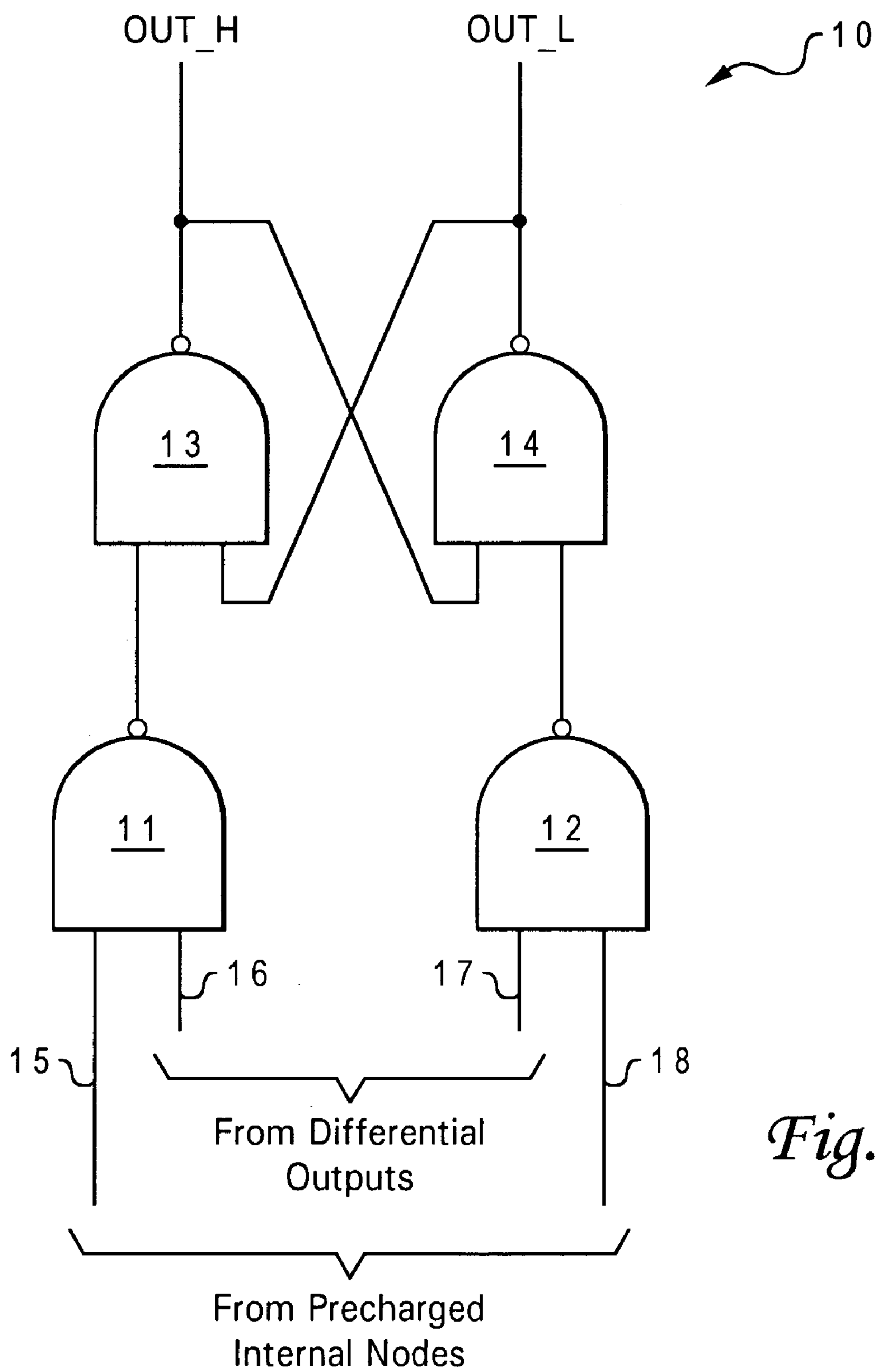
FIG. 1 is a circuit diagram of a latch circuit, in accordance with a preferred embodiment of the present invention.

Referring now to the drawings and in particular to FIG. 1, there is depicted a circuit diagram of a latch circuit, in accordance with a preferred embodiment of the present invention. As shown, a latch circuit 10 includes a two-input NAND gate 11, a two-input NAND gate 12, a two-input NAND gate 13 and a two-input NAND gate 14. The output of NAND gate 11 is connected to a first input of NAND gate 13. The output of NAND gate 12 is connected to a first input of NAND gate 14. Input 15 of NAND 11 and input 18 of NAND 12 are connected to complementary precharged internal nodes of a complementary dynamic logic circuit (not shown) that need to be staged. Input 16 of NAND 11 and input 17 of NAND 12 are connected to corresponding differential outputs of the same dynamic logic circuit.

NAND gates 13 and 14 are cross-coupled to each other to form a set-reset structure. Specifically, the output of NAND gate 13 is connected to a second input of NAND gate 14, and the output NAND gate 14 is connected to a second input of NAND gate 13.

During operation, the two internal nodes of the dynamic logic circuit are precharged to a logical "1" during one phase of the clock. Then, one of the two internal nodes of the dynamic logic circuit is pulled to a logical "0" during an intermediate subsequent opposite phase of the clock. The inputs of NAND gates 13 and 14 are subsequently driven by the outputs of NAND gates 11 and 12. The set-reset structure of NAND gates 13 and 14 stores the logic values of NAND gates 11 and 12 after NAND gates 11 and 12 have transitioned to a logical "1," which occurs during the clock phase latch circuit 10 has triggered. The set-reset structure of NAND gates 13 and 14 holds the logic values of precharged internal nodes of the dynamic logic circuit for a full clock cycle. The outputs of NAND gates 11 and 12 remained at a logical "1" until the internal nodes of the dynamic logic circuit are precharged, which occurs after the opposite edge of the clock latch circuit 10 was triggered from. As a result, the old logic values are held for an additional clock phase.

When one of the internal nodes of the dynamic logic circuit is pulled low, latch circuit 10 holds the logic values from the previous clock cycle, preventing the new logic values from reaching the next latch. Only after both internal nodes of the dynamic logic circuit are precharged will latch circuit 10 be written with the new logic values of the internal nodes of the dynamic logic circuit. Thus, a race condition is prevented by detecting that one of the internal nodes of the dynamic logic circuit has been pulled to a logical "0" before the corresponding (external) input coming from the set-reset latch has transitioned to a logical "1."

Latch circuit 10 provides a pair of differential outputs, OUT_H and OUT_L, which corresponds to the two differential outputs of the dynamic logic circuit. The two internal nodes of latch circuit 10, which behave exactly as described above, allows latch circuit 10 itself to be cascaded to asynchronously delay inputs 16 and 17 for several phases without clock latches. Clock latches are only needed every few clock cycles to eliminate the skew added with each clock phase and re-synchronize the signals.

A complementary-metal oxide semiconductor (CMOS) NAND gate, such as NAND gate 11 or 12, is commonly formed with two stacked n-channel transistors. In order to ensure that NAND gates 11 and 12 transition to a logical "1" as soon as possible after the two corresponding internal node of the dynamic logic circuit have transitioned to a logical "0," input 15 of NAND gate 11 and input 18 of NAND gate 12 are connected to the n-channel transistors at the top of the stack of n-channel transistors within NAND gates 11 and 12, respectively. For additional assurance, a pair of inverters may be added to the inputs to NAND gates 11 and 12, as shown in FIG. 2.

Figure 2:
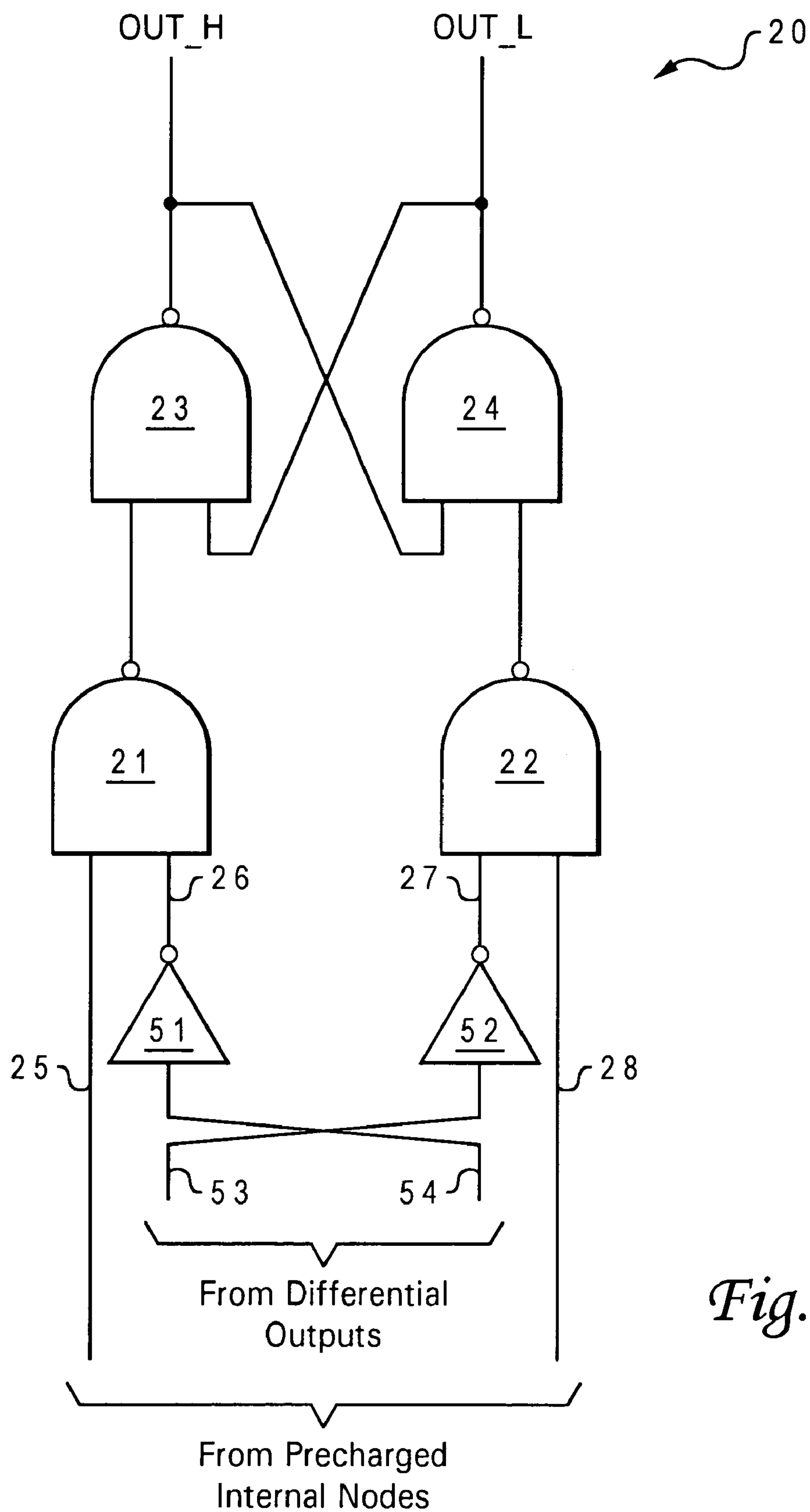
FIG. 2 is a circuit diagram of a latch circuit, in accordance with an alternative embodiment of the present invention.

With reference now to FIG. 2, there is depicted a circuit diagram of a latch circuit, in accordance with an alternative embodiment of the present invention. As shown, a latch circuit 20 includes a two-input NAND gate 21, a two-input NAND gate 22, a two-input NAND gate 23 and a two-input NAND gate 24. The output of NAND gate 21 is connected to a first input of NAND gate 23. The output of NAND gate 22 is connected to a first input of NAND gate 24. Input 25 of NAND 21 and input 28 of NAND 22 are connected to corresponding precharged internal nodes of a dynamic logic circuit (not shown) that need to be staged. Input 26 of NAND 21 is connected to an inverter 51, and input 27 of NAND 22 is connected to an inverter 52. Input 54 of inverter 51 and input 53 of inverter 52 are connected to corresponding differential outputs of the same dynamic logic circuit. With the presence of inverters 51 and 52, there is even more delay in the delay path from the differential outputs of the dynamic logic circuit.

The output of NAND gate 23 is connected to a second input of NAND gate 24. The output of NAND gate 24 is connected to a second input of NAND gate 23. The outputs of NAND gate 23 and NAND gate 24 are differential outputs that correspond to the differential outputs of the dynamic logic circuit that needed to be staged.

Figure 3:
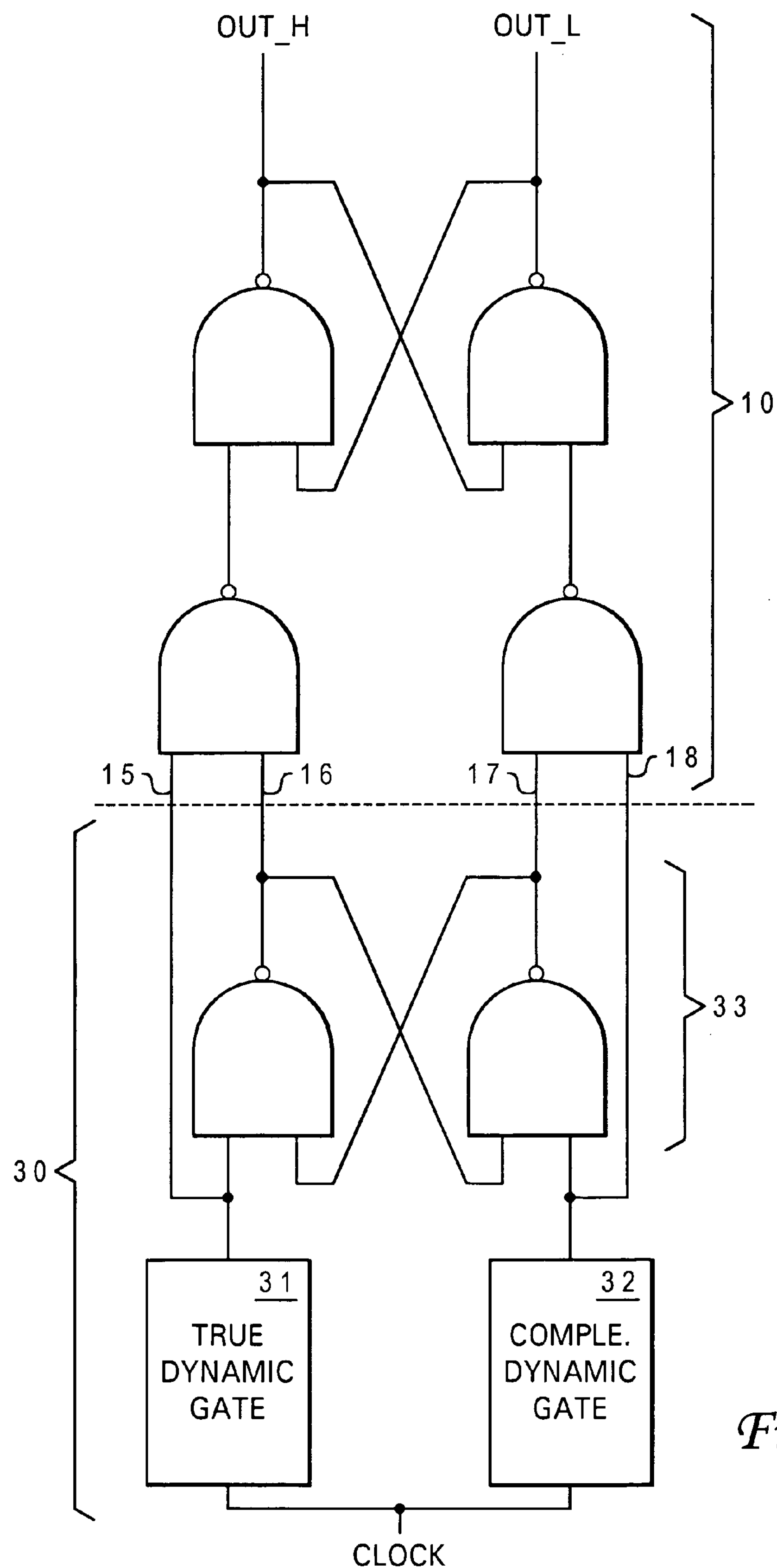
FIG. 3 is a circuit diagram of the latch circuit from FIG. 1 to be used in conjunction with a complementary dynamic logic circuit, in accordance with a preferred embodiment of the present invention.

Referring now to FIG. 3, there is illustrated a circuit diagram of latch circuit 10 to be used in conjunction with a complementary dynamic logic circuit, in accordance with a preferred embodiment of the present invention. As shown, a complementary dynamic logic circuit 30 includes a true dynamic gate 31, a complement dynamic gate 32 and a set-reset latch 33. The output of true dynamic gate 31 is connected to one of the inputs of set-reset latch 33 and to input 15 of latch circuit 10. The output of complement dynamic gate 32 is connected to the other input of set-reset latch 33 and to input 18 of latch circuit 10. The outputs of set-reset latch 33 are connected to corresponding inputs 16 and 17 of latch circuit 10.

True dynamic gate 31 computes a logic function while complement dynamic gate 32 computes the logical complement of the same logic function. Set-reset latch 33 latches the outputs of dynamic gates 31 and 32 to exploit the fact that the outputs of dynamic gates 31 and 32 are precharged during one phase.

A dynamic logic gate, such as true dynamic gate 31 and complement dynamic gate 32, only maintains the correct logical output during one clock phase. The output is initially precharged to a specific logical value, preferably a logical "1." The precharge is then disabled, and an evaluate transistor is turned on to activate the dynamic logic gate. The evaluate transistor allows current to flow through a network of n-channel transistors that perform a logic function of the inputs. If the logic function of the dynamic logic gate is determined to be a logical "0" based on the inputs, the current flows through the network of n-channel transistors and the evaluate transistor discharges the precharged output of the dynamic logic gate to a logical "0." Conversely, if the output of the dynamic logic gate should remain a logical "1," current does not flow through the network of n-channel transistors during evaluation, and capacitance on the dynamic output node holds the charge from the precharge phase such that the output remains at a logical "1."

The output of the dynamic logic gate attains the correct value some time after the evaluate transistor is turned on (during the evaluation phase of the clock, opposite the precharge phase). However, on the very next clock phase (the next precharge phase), the output changes to a logical "1" regardless of the inputs being applied to the gate. This is different from a static gate in which the output changes in response to changes the values of the input signals, and not otherwise.

So, it is often desired that the output of a dynamic logic gate to remain stable over an entire clock cycle, even during the precharge phase when the internal node is being pulled high. Such task is handled by set-reset latch 33. When dynamic logic gates 31 and 32 are evaluating, the output of one of the gates is pulled from a logical "1" to a logical "0." This is reflected at the outputs of set-reset latch 33 a short time later. When both dynamic logic gates 31 and 32 are being precharged, the inputs to set-reset latch 33 are both logical "1," which causes set-reset latch 33 to hold the previous value. That is, when a dynamic input that was pulled low during the evaluation (clock) phase is precharged to a logical "1" again, the outputs of set-reset latch 33 do not change. The feedback hold the differential value, and the outputs of dynamic logic gates 31 and 32 are held for a full clock cycle.

Figure 4:
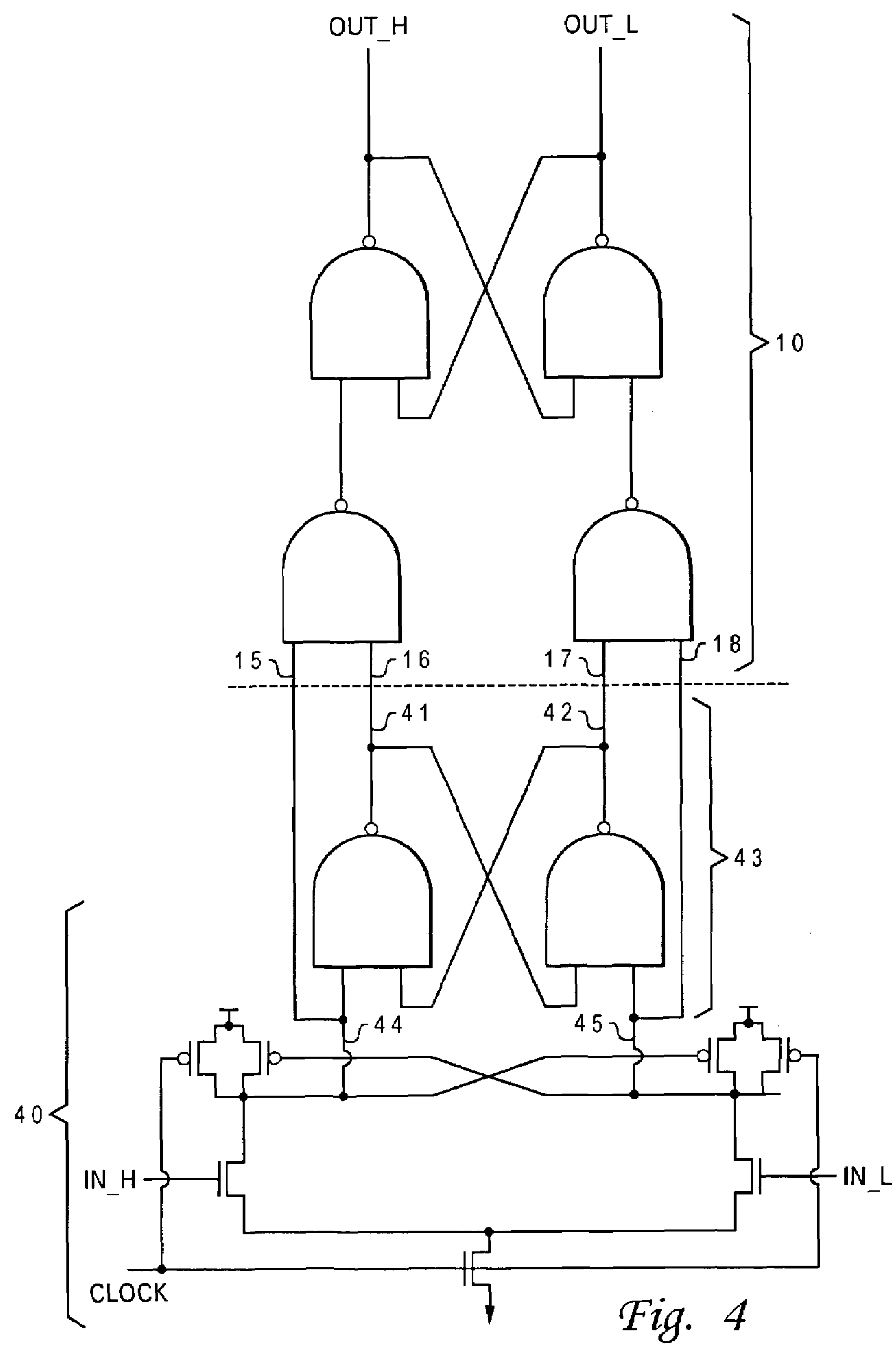
FIG. 4 is a circuit diagram of the latch circuit from FIG. 1 to be used in conjunction with a differential sense amplifier, in accordance with a preferred embodiment of the present invention.

With reference now to FIG. 4, there is illustrated a circuit diagram of latch circuit 10 to be used in conjunction with a differential sense amplifier, in accordance with a preferred embodiment of the present invention. As shown, a differential sense amplifier 40 includes a pair of differential outputs 41 and 42 via a set-reset latch 43. The structure of differential sense amplifier 40 is well-known to those skilled in the art. Output 41 of differential sense amplifier 40 is connected to input 16 of latch circuit 10. Output 42 of differential sense amplifier 40 is connected to input 17 of latch circuit 10. An internal node 44 of differential sense amplifier 40 is connected to input 15 of latch circuit 10 and to a first input of set-reset latch 43. An internal node 45 of differential sense amplifier 40 is connected to input 18 of latch circuit 10 and a second input of set-reset latch 43. Set-reset latch 43 latches the outputs of differential sense amplifier 40 to exploit the fact that the outputs of differential sense amplifier 40 are precharged during one phase.

As has been described, the present invention provides an improved latch circuit that is capable of overcoming race conditions within a dynamic logic circuit. The latch circuit of the present invention can exploit the timing of internal signals in complementary dynamic logic circuits and differential sense amplifiers to asynchronously latch signals after the clock edge opposite from which the signals are originated. Although only NAND gates are utilized to illustrate the present invention, it is understood by those skilled in the art that other types of logic gates such as NOR gates can also be used.

While the invention has been particularly shown and described with reference to a preferred embodiment, it will be understood by those skilled in the art that various changes in form and detail may be made therein without departing from the spirit and scope of the invention.

What is claimed is:

1. A latch circuit for complementary dynamic logic, said latch circuit comprising:

a first logic gate having a first input and a second input, wherein said first input is connected to a first precharged internal node of said complementary dynamic logic, and said second input is connected to a first differential output of said complementary dynamic logic;

a second logic gate having a first input and a second input, wherein said first input is connected to a second precharged internal node of said complementary dynamic logic, and said second input is connected to a second differential output of said complementary dynamic logic;

a third logic gate having a first input connected to an output of said first logic gate to provide a first output for said latch circuit; and a fourth logic gate having a first input connected to an output of said second logic gate to provide a second output for said latch circuit, wherein said second output is connected to a second input of said third logic gate, and said first output is connected to a second input of said fourth logic gate.

2. The latch circuit of claim 1, wherein said first and second outputs are differential outputs.

3. The latch circuit of claim 1, wherein inputs of said first and second logic gates are connected to transistors at the top of the stack of transistors within said first and second logic gates.

4. A latch circuit capable of ensuring race-free staging of signals for a complementary dynamic logic circuit, said latch circuit comprising:

a first NAND gate having a first input and a second input, wherein said first input is connected to a first precharged internal node of said complementary dynamic logic circuit, and said second input is connected to a first differential output of said complementary dynamic logic circuit;

a second NAND gate having a first input and a second input, wherein said first input is connected to a second precharged internal node of said complementary dynamic logic circuit, and said second input is connected to a second differential output of said complementary dynamic logic circuit;

a third NAND gate having a first input connected to an output of said first NAND gate to provide a first output for said latch circuit; and a fourth NAND gate having a first input connected to an output of said second NAND gate to provide a second output for said latch circuit, wherein said second output is connected to a second input of said third NAND gate, and said first output is connected to a second input of said fourth NAND gate.

5. The latch circuit of claim 1, wherein said first and second outputs are differential outputs.

6. The latch circuit of claim 1, wherein inputs of said first and second NAND gates are connected to transistors at the top of the stack of transistors within said first and second NAND gates.

7. A latch circuit capable of ensuring race-free staging of signals for a complementary dynamic logic circuit, said latch circuit comprising:

a first NOR gate having a first input and a second input, wherein said first input is connected to a first precharged internal node of said complementary dynamic logic circuit, and said second input is connected to a first differential output of said complementary dynamic logic circuit;

a second NOR gate having a first input and a second input, wherein said first input is connected to a second precharged internal node of said complementary dynamic logic circuit, and said second input is connected to a second differential output of said complementary dynamic logic circuit;

a third NOR gate having a first input connected to an output of said first NOR gate to provide a first output for said latch circuit; and a fourth NOR gate having a first input connected to an output of said second NOR gate to provide a second output for said latch circuit, wherein said second output is connected to a second input of said third NOR gate, and said first output is connected to a second input of said fourth NOR gate.

8. The latch circuit of claim 1, wherein said first and second outputs are differential outputs.

9. The latch circuit of claim 1, wherein inputs of said first and second NOR gates are connected to transistors at the top of the stack of transistors within said first and second NOR gates.

* * * * *